United States Patent [19]

Ohno et al.

[11] Patent Number: 5,227,662

[45] Date of Patent: Jul. 13, 1993

[54] COMPOSITE LEAD FRAME AND SEMICONDUCTOR DEVICE USING THE SAME

[75] Inventors: Yasuhide Ohno; Yoshio Ohzeki, both of Kawasaki, Japan

[73] Assignee: Nippon Steel Corporation, Tokyo, Japan

[21] Appl. No.: 959,474

[22] Filed: Oct. 9, 1992

Related U.S. Application Data

[63] Continuation of Ser. No. 721,770, Jun. 28, 1991, abandoned, which is a continuation-in-part of Ser. No. 701,762, May 17, 1991.

[30] Foreign Application Priority Data

May 24, 1990 [JP] Japan ................................ 2-134354
Oct. 19, 1990 [JP] Japan ................................ 2-281083

[51] Int. Cl.$^5$ .................... H01L 23/02; H01L 21/60
[52] U.S. Cl. ........................... 257/676; 257/675; 257/666; 257/668; 257/784
[58] Field of Search ........................ 357/70, 72, 80

[56] References Cited

U.S. PATENT DOCUMENTS

| | | |
|---|---|---|
| 4,330,790 | 5/1982 | Burns . |
| 4,438,181 | 3/1984 | Schroeder . |
| 4,465,967 | 1/1984 | Reid . |
| 4,754,317 | 6/1988 | Comstock . |
| 4,774,635 | 9/1988 | Greenberg et al. . |
| 4,796,078 | 1/1987 | Phelps, Jr. et al. . |
| 4,806,503 | 2/1989 | Yoshida et al. ........................ 357/80 |
| 4,994,897 | 2/1991 | Golubic et al. ........................ 357/81 |
| 5,029,325 | 7/1991 | Higgins, III et al. .................. 357/80 |
| 5,061,988 | 10/1991 | Rector ................................... 357/80 |
| 5,065,528 | 11/1991 | Hernandez et al. ................. 361/388 |
| 5,073,817 | 12/1991 | Ueda ..................................... 357/81 |

FOREIGN PATENT DOCUMENTS

| | | |
|---|---|---|
| 0247644 | 12/1987 | European Pat. Off. . |
| 0247775 | 12/1987 | European Pat. Off. . |
| 58-107659 | 6/1983 | Japan . |
| 60-120543 | 6/1985 | Japan . |
| 62-232948 | 10/1987 | Japan . |
| 63-53939 | 3/1988 | Japan . |
| 63-104458 | 5/1988 | Japan . |
| 2-22850 | 1/1990 | Japan . |
| 0414257 | 2/1991 | Japan . |

OTHER PUBLICATIONS

D. Mallik et al., "Multi-Layer Molded Plastic Package", p. 223, Paragraph 1, FIG. 4 Proceedings of the IEEE/CHMT 1989, Electronic Manufacturing Technology Symposium 1989, New York, pp. 221-229.

Primary Examiner—Eugene R. LaRoche
Assistant Examiner—Viet Q. Nguyen
Attorney, Agent, or Firm—Cushman, Darby & Cushman

[57] ABSTRACT

A composite lead frame comprising a lead frame (10), leads (28) supported on a plastic film (22') having a device hole (24), and a metal (14, 32) for mounting a semiconductor chip (34) is disclosed. The lead frame (10) has a plurality of inner lead portions (12) each of which is bonded to each of the leads (28), respectively. The metal (14, 32) also supports the leads (28) through the plastic film (22'). The metal (14, 32) may be bonded to the lead frame (10) through an adhesive tape (16), or may be integrated with the lead frame (10). Bonding wires (36) to connect the leads (28) and the semiconductor chip (34) can be easily and securely bonded to the leads (28) in virtue of the metal (14, 32) supporting the leads (28). Additionally, a semiconductor device incorporating the composite lead frame has efficient heat dissipation and reliability by virtue of the metal pad.

15 Claims, 4 Drawing Sheets

COMPOSITE LEAD FRAME AND SEMICONDUCTOR DEVICE USING THE SAME

This is a continuation of application Ser. No. 07/721,770, filed on Jun. 28, 1991, which was abandoned upon the filing hereof, which is a continuation-in-part of Ser. No. 07/701,762, filed May 17, 1991.

FIELD OF THE INVENTION

The present invention relates to a composite lead frame used in the manufacturing of packaged semiconductor devices in the semiconductor electronic industry, and a semiconductor device using the composite lead frame.

DESCRIPTION OF THE RELATED ART

Recently, as the scale of integration of semiconductor devices has been increased and their functions have become more complex, the number of pins of a package has been increased, and therefore, lead frames having a higher dimensional accuracy and finer pitch have been required. Particularly, these features are intensively required in ASIC (Application Specific Integrated Circuit) devices.

A press working method or an etching method is employed to make the lead frame at the present time. In the etching method, lead frames having a finer pitch can be made than those made in the press working method, but the etching method entails manufacturing costs which are several times as much as the press working method. The lower limit of the width of a lead that can be made with the etching method is reportedly seventy to eighty percent of the thickness of the lead. Therefore, a thinner plate must be used to make a lead frame having a finer pitch. However, a thinner plate does not have sufficient strength, so that negative effects such as bending of leads occur in handling of bonding, etc. of the packaged semiconductor device. The limit of thickness is 0.1 to 0.15 mm and the limit of the number of pins is about 200.

On the other hand, a TAB (Tape Automated Bonding) technique can be applied to provide a larger number of pins. In the TAB technique, however, the strength of the leads is low because they are made from a copper sheet. Therefore, many problems such as misalignment arise in external bonding, so that the bonding of the leads cannot be handled in the same manner as in the conventional lead frame.

As a lead frame which realizes the larger number of pins, a composite lead frame, comprising first lead members and second lead members arranged in the inside of the first lead members such that inner lead portions of the first lead members overlap the outer lead portions of the second lead members to be bonded to them, wherein the second lead members are formed with a semiconductor chip mounting part from a metal sheet on an insulating plastic film using a photoetching method, is disclosed in Japanese Unexamined Patent Publication (Kokai) No. 62-232948. Connections between the second lead members and the semiconductor chip mounted on the semiconductor chip mounting part are performed by wire bonding. Japanese Unexamined Patent Publication (Kokai) No. 2-22850 discloses a similar composite lead frame wherein all the second lead members are bonded to the semiconductor chip at the same time through bumps formed on the chip, as is done in the TAB technique.

However, these composite lead frames which have been proposed have the following shortcomings.

The former composite lead frame has a problem that heat dissipation is not sufficient where a chip having large heating value due to large scale of integration is mounted because the bottom layer of the composite lead frame under the chip is as insulating film having low thermal conductivity. Additionally, when bonding wires to connect the semiconductor chip to the second lead members are bonded on the second lead members, sufficient supersonic vibration for bonding is not obtained, because the second lead members are made of copper sheet and an insulating tape supporting the second lead members has low rigidity. Therefore, imperfect bonds are sometimes generated in wire bonding. Furthermore, when sealing with resin, connections between the first lead members and the second lead members tend to be damaged due to deformation of the second lead members because of their low rigidity.

The latter composite lead frame has many additional industrial problems so that a technique to form low-priced and uniform bumps on a chip has not yet been established.

SUMMARY OF THE INVENTION

An object of the present invention is to provide a composite lead frame suitable for manufacturing a semiconductor device having a larger number of pins.

Another object of the present invention is to provide a composite lead frame suitable for manufacturing a semiconductor device having excellent heat dissipation characteristics.

Another object of the present invention is to provide a composite lead frame wherein the aforementioned shortcomings are overcome.

Still another object of the present invention is to provide a semiconductor device wherein the aforementioned composite lead frame is used.

In accordance with the present invention, there is provided a composite lead frame which includes a lead frame having a plurality of first lead fingers bonded to corresponding second lead fingers which are supported on a film member having a device hole for accepting a semiconductor chip. Also included is a pad for mounting and heat sinking the semiconductor chip. The pad is bonded to the first lead fingers by bonding means which also provide electrical insulation between the pad and first fingers.

In accordance with the present invention there is also provided a semiconductor device comprising a semiconductor chip, a lead frame having a plurality of first lead fingers bonded to corresponding second lead fingers which are supported on a film member having a device hole for accepting the semiconductor chip, the semiconductor chip being connected to the second lead fingers through bonding wires. Also included is a pad for mounting and heat sinking the semiconductor chip. The pad is bonded to the first lead fingers by bonding means which provides electrical insulation between the pad and first fingers. A sealing member seals the semiconductor chip, the second lead fingers, bonded portions between the first and second lead fingers and at least a part of the pad.

Further objects, advantages and the construction of the invention will become apparent from the following description in conjunction with the drawings.

DESCRIPTION OF THE PREFERRED EMBODIMENTS

FIGS. 1A to 1E are diagrams for explaining a manufacturing process of a composite lead frame according to a first embodiment of the present invention.

Figure 1A:
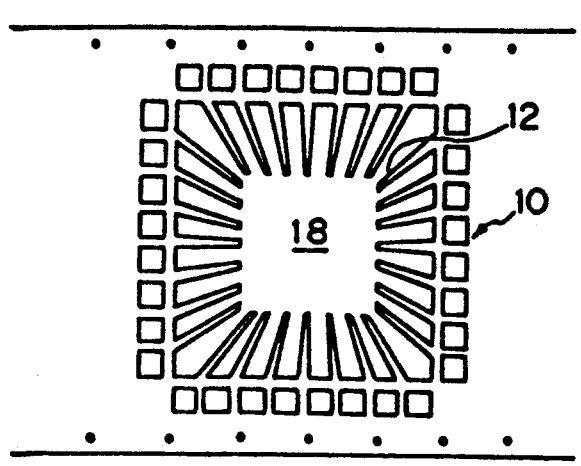
FIGS. 1A to 1E are diagrams for explaining a manufacturing process of a composite lead frame according to a first embodiment of the present invention.

Referring to FIG. 1A, a lead frame 10 having inner lead portions 12 is shown. The lead frame 10 can be manufactured from a metal sheet using, for example, a press working method to make conventional lead frames. As shown in FIG. 1B, a metal 14 is bonded to the lead frame 10 through an insulating adhesive tape or bonding means 16 (not shown in this figure) so that the metal 14 covers a window 18 (FIG. 1A) of the lead frame 10.

Figure 1C:
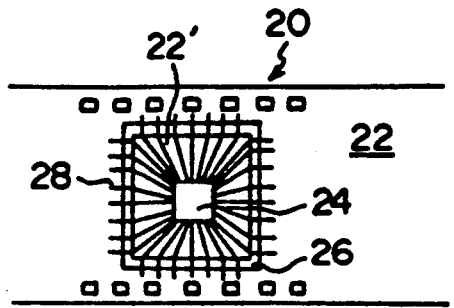
Figure 1B:
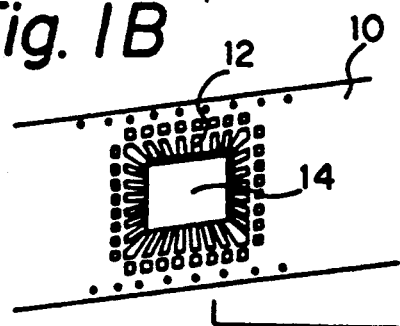

Referring to FIG. 1C, a tape assembly 20 manufactured by using the TAB technique is shown. The tape assembly 20 comprises a plastic film 22 and 22' having a device hole 24 and an outer lead hole 26 formed by punching, etc., and a plurality of leads 28 formed by a photo-etching method, etc., according the TAB technique. Note that the leads 28 do not project onto the device hole 24, because connections between the leads 28 and a semiconductor chip are performed not through bumps on the semiconductor chip but through bonding wires.

Figure 1D:
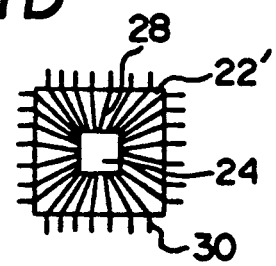

The leads 28 and a portion of the plastic film 22' supporting the leads 28 are cut out from the tape assembly 20 at the outer lead hole 26, as shown in FIG. 1D.

Figure 1E:
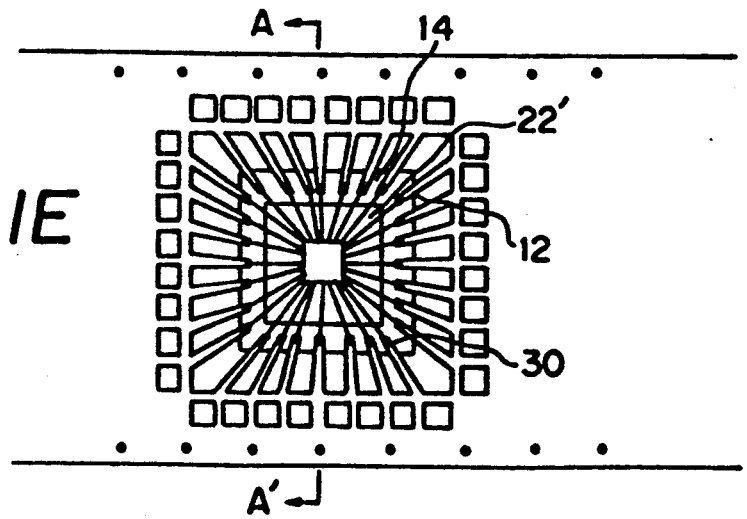

As shown in FIG. 1E, the portion of the plastic film 22' is bonded to the metal 14 through the insulating adhesive tape 16 (not shown in this figure) so that each of outer lead portions 30 of the leads 28 and each of inner lead portions 12 of the lead frame 10 is overlapped respectively, and they are bonded together by thermocompression bonding, at the overlapping portion.

Figure 2:
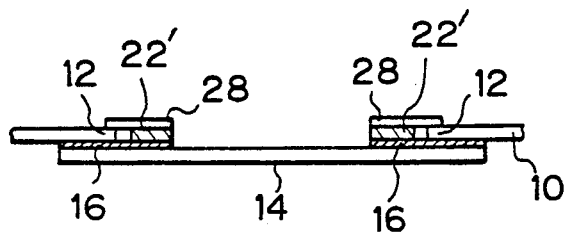
FIG. 2 is an A—A' cross-sectional view of the composite lead frame according to the first embodiment of the present invention.

FIG. 2 is an A—A' cross-sectional view of the composite lead frame according to the first embodiment of the present invention. In this figure, the aforementioned insulating adhesive tape 16 is bonded between the metal 14 and the inner lead portions 12 of the lead frame 10 and between the metal 14 and the plastic film 22'.

In external connection, a conventional bonding technique can be applied, since the same material as that of the conventional lead frames can be used for the lead frame 10. Additionally, since connection to the semiconductor chip is performed through the leads 28, width and pitch of the leads 12 of the lead frame 10 need not be narrow. Therefore, the conventional lead frames can be used for the devices having a larger number of pins.

Regarding the inner portion, the leads 28 can be finely processed using the TAB technique.

Furthermore, use of the metal 14 having efficient thermal conductivity and rigidity provides the following merit.

(a) Dissipation of heat generated in the semiconductor chip is more facilitated than with the sole use of the insulating film.

(b) Application of supersonic vibration is easier since the leads 28 are supported on the rigid metal 14 through the plastic film 22'. Therefore reliable bonding is performed by a conventional wire bonding machine.

(c) Since undesirable stress is not applied to junctions by virtue of the metal 14, damaging of connections is avoided, when resin sealing.

Figure 3A:
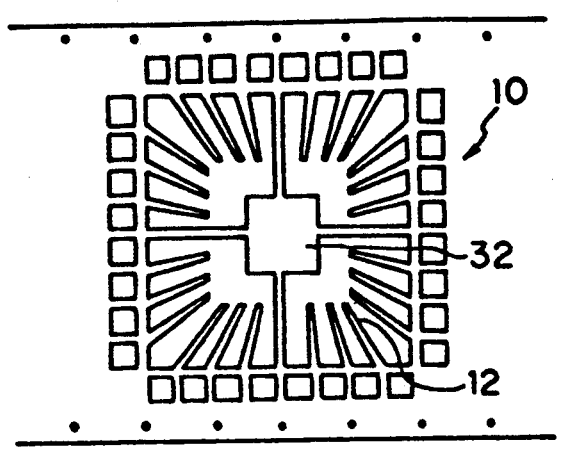
FIGS. 3A to 3D are diagrams for explaining a manufacturing process of a composite lead frame according to a second embodiment of the present invention.
Figure 3B:
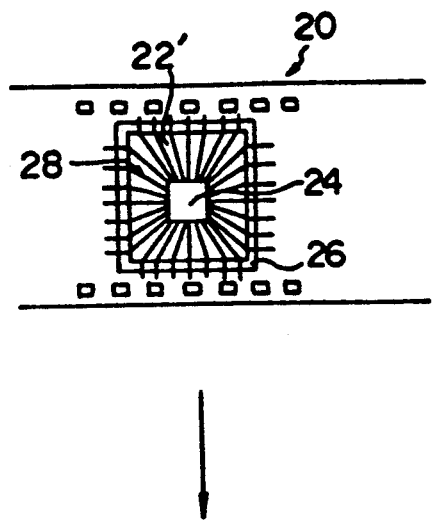
Figure 3C:
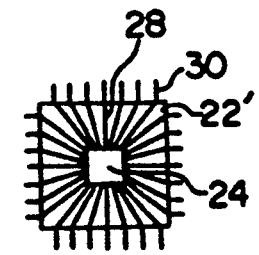
Figure 3D:
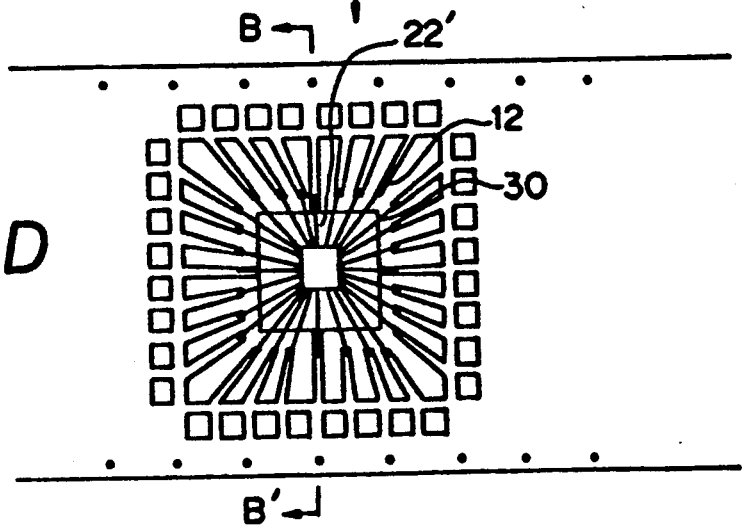
Figure 4:
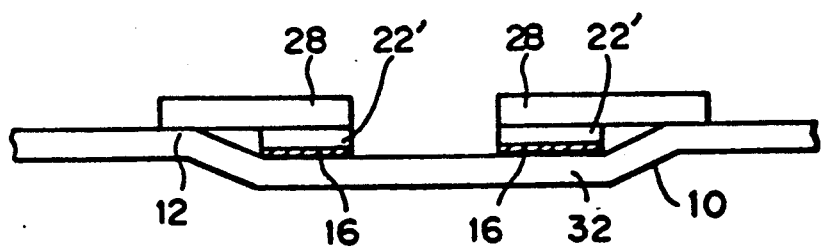
FIG. 4 is a B—B' cross-sectional view of the composite lead frame according to the second embodiment of the present invention.

FIGS. 3A to 3D are diagrams for explaining a manufacturing process of a composite lead frame according to a second embodiment of the present invention, and FIG. 4 is a B—B' cross-sectional view of the composite lead frame. The same reference numerals as used in FIGS. 1A to 1E and 2 are used for constituents which are similar to those in FIGS. 1A to 1E and 2, and thus descriptions thereof are left out.

As shown in FIG. 3A, a lead frame 10 has a portion 32 in a body, and therefore, the composite lead frame according to the second embodiment of the present invention has an advantage of low manufacturing cost. Nevertheless, it inevitably has the following limitations:

(a) The portion 32 cannot be larger than a space surrounded by ends of inner lead portions 12.

(b) The portion 32 cannot be thicker than the lead frame 10, the thickness of which is limited to a certain level.

(c) The material of the portion 32 must be the same as that of the lead frame 10.

Generally, heat generated in operating semiconductor chip is dissipated by a heat conduction into the ambient atmosphere of a package and by a heat conduction through leads to a circuit board. To improve the heat dissipation characteristics of the package, it is important to quickly diffuse the heat generated in the chip to the whole package, and to quickly conduct the heat to the leads.

Even in a semiconductor device using the composite lead frame shown FIG. 3D and FIG. 4, the portion 32 serves as a heat sink to slightly improve the heat dissipation characteristics, because the portion 32 conducts the heat generated in the chip toward the opposite ends of the leads.

In this type of lead frame, however, an optimum selection of the material for the lead frame is difficult, because generally material having an optimum quality for a heat conductor cannot have the optimum quality for a lead frame.

The basic characteristics required from a material for the lead frame are an excellent electrical conductivity, a moderate heat conductivity, and sufficient mechanical strength to withstand repeated bending. In addition, the secondary characteristics required in the material for the lead frame are corrosion resistance, a plating ability, a solderability, a workability, a wire-bonding ability, a heat tolerance, and a nonmagnetism. If an Fe-42% Ni alloy, which has excellent characteristics, is used as material for the lead frame, the heat sink made from the same material does not exhibit an excellent heat conductivity. In a copper alloy, if the purity of copper is raised, the heat conductivity becomes higher but the mechanical strength becomes lower. If microelement is added to improve the mechanical strength, the aforementioned secondary characteristics, such the workability, becomes poor.

In addition, since the size of the heat sink is limited, a sufficient heat dissipation to the package is not obtained, and since the heat sink cannot overlap the lead frame, the heat resistance in this portion is high.

On the other hand, the lead frame described with reference to FIGS. 1A to 1E and 2 does not have the aforementioned limitations (a), (b) and (c), because metal 14 is prepared separately from the lead frame 10, and is bonded to the lead frame 10 through the insulating adhesive tape 16. Therefore, material, thickness, size, and shape of the metal can be adequately selected for use as a heat sink, as follows.

(a) Even where a lead frame must be made from a thinner plate, to realize a fine pitch, a heat sink having a sufficient thickness can be used.

(b) A heat sink can overlap inner lead portions of the lead frame, and thus the heat resistance between the heat sink and the inner lead portions can be lowered.

Figure 5:
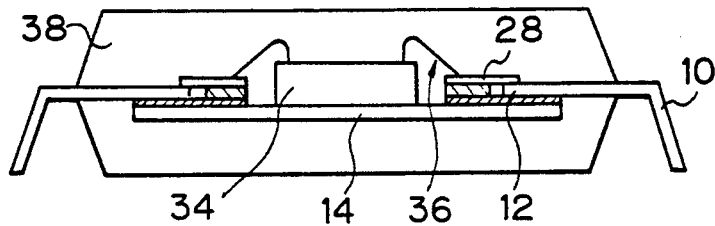
FIG. 5 is a cross-sectional view of a semiconductor device according to the present invention.

FIG. 5 is a cross-sectional view of a semiconductor device using the composite lead frame described with reference to FIGS. 1A to 1E and 2. A semiconductor chip 34 is mounted on the metal 14, and is connected to the leads 28 through bonding wires 36. Finally, the semiconductor chip 34 and the composite lead frame around the chip 34 are sealed with resin 38.

Figure 6:
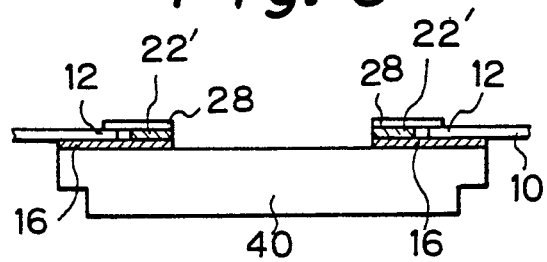
FIG. 6 is a cross-section view of the composite lead frame according to a third embodiment of the present invention.
Figure 7:
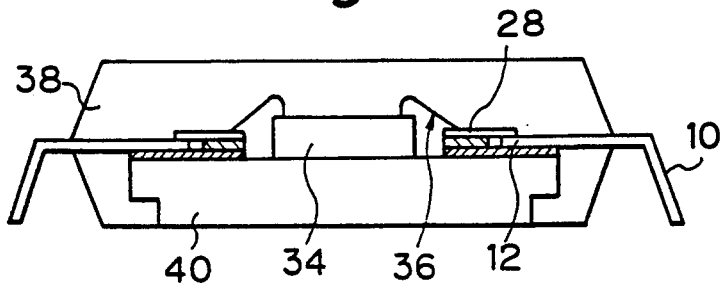
FIG. 7 is a cross-sectional view of another semiconductor device according to the present invention.

FIG. 6 is a cross-sectional view of a composite lead frame according to a third embodiment of the present invention, and FIG. 7 is a cross-sectional view of a semiconductor device using the composite lead frame of FIG. 6.

A heat sink 40 has a thickness sufficient that the bottom surface thereof is exposed after the sealing member, such as a resin 38, is applied, as shown in FIG. 7. Heat generated in a semiconductor chip 34 is dissipated not only through the resin 38, which is not an excellent heat conductor, but also through the heat sink 40, which is an excellent heat conductor. SiC and AlN also can be selected as the material of the heat sink 40. The heat sink 40 has a stepped cross section, so as to improve the affinity thereof with the resin 38, as shown in FIGS. 6 and 7.

EXAMPLE 1

A lead frame 10, as shown in FIG. 1A, having 350 pins, was made from a 0.15 mm thick plate of copper alloy. A metal 14 was made from the same material, and the lead frame 10 and the metal 14 were bonded with a tape 16. Leads 28 supported on a plastic film 22' having device hole 24 were made by using the TAB technique. Outer lead portions 30 of the leads 28 and inner lead portions 12 of the lead frame 10 were bonded together, to make a composite lead frame. The inner lead portions 12 were plated with silver at a thickness of 3.5 $\mu$m, the leads 28 were plated with gold, and they were bonded together by thermo-compression bonding.

A semiconductor chip was mounted on the composite lead frame and was connected to the leads 28 with gold bonding wires using a ball bonding technique. After a bonding strength test of the wire bonding, all connections were broken at "ball neck" portions (portions near the balls). This indicates that bonding strength at second bonding portions, i.e., bonding of the leads 28 and wires, is insufficient.

EXAMPLE 2

A lead frame 10 having a portion 32 in a body, as shown in FIG. 4, having 350 pins, was made from a 0.15 mm thick plate of copper alloy. A composite lead frame was made by bonding the lead frame 10 and leads 28 supported on a plastic film 22' having device hole 24 made by using the TAB technique. The inner lead portions 12 was plated with silver at a thickness Of 3.5 $\mu$m, the leads 28 were plated with gold and they were bonded together by thermo-compression bonding.

After the same bonding strength test as Example 1, all connections were broken at ball neck portions.

EXAMPLE 3

A semiconductor chip 34 was mounted on the composite lead frame a described in Example 1, the semiconductor chip 34 and leads 28 were connected with bonding wires 36, and they were sealed with resin 38, to make a semiconductor device having 350 pins, a shown in FIG. 5.

As a result of a temperature cycling test of the device repeated for 30 minutes at $-55°$ C. and 30 minutes at 150° C., the device was not deteriorated after 300 cycles.

EXAMPLE 4

A lead frame having 216 pins was made from a 0.15 mm thick plate of Fe $-42\%$ nickel alloy. A metal for die bonding of a semiconductor chip was made from a 0.10 mm thick plate of copper alloy, and was bonded with the lead frame through an adhesive tape. Leads supported on a plastic film were made by using the TAB technique. A composite lead frame was made by bonding outer leads of the leads and inner leads of the lead frame in a process shown in FIGS. 1A to 1B. The inner lead portions of the lead frame were plated with silver at a thickness of 3.5 $\mu$m thickness, the leads supported on the plastic film were plated with gold, and they were bonded together by thermo-compression bonding.

After the same bonding strength test as Example 1, all connection were broken at ball neck portions.

EXAMPLE 5

A lead frame having a portion in a body for mounting a semiconductor chip having 360 pins was made from a 0.125 mm thick plate of Fe $-42\%$ nickel alloy. A composite lead frame was made by bonding the lead frame and leads supported on a plastic film having a device hole made by using the TAB technique, in a process shown in FIGS. 3A to 3D. The inner lead portion of the lead frame was plated with tin at a thickness of 2.8 $\mu$m, the leads supported on the film were plated with gold, and they were bonded together by thermo-compression bonding.

EXAMPLE 6

A semiconductor chip was mounted on the portion of the lead frame of Example 5, the semiconductor chip was connected to the inner lead of the leads through bonding wires, and they were sealed with resin, to make a semiconductor device having 360 pins.

As a result of a temperature cycling test for the device repeated for 30 minutes at $-55°$ C. and 30 minutes at 150° C., the device Was not deteriorated after 300 cycles.

COMPARATIVE EXAMPLE

A composite lead frame was made from a lead frame and a copper sheet pattern supported on a plastic film. The lead frame is the same as that used in Example 1. The copper sheet pattern has a plurality of leads to be bonded with the lead frame and an island portion for mounting a semiconductor chip, as disclosed in Japanese Unexamined Patent Publication No. 62-232948. A semiconductor chip was die bonded on the island portion, and wire bonding was carried out under the same conditions as Example 3. Also, a semiconductor device for comparison was made by sealing with resin.

As a result of a bonding strength test of the wire bonding, a second bonding was found to be broken away at 6.5% of leads.

Next, a comparative test of this semiconductor device with the device of Example 3 was conducted.

A semiconductor chip which is uniformly exothermic in operation was mounted. The result of measurement of surface temperature of the devices two hours after initiation of operation was 78° C. in the comparative device, and 47° C. in the device according to the present invention, which shows efficient heat dissipation.

Additionally, the percentage of defective comparative devices in the temperature cycling test repeated for 30 minutes at −55° C. 150° C., was 0.04% after 300 cycles.

We claim:

1. A composite lead frame, comprising:
   a lead frame having a plurality of first lead fingers,
   a plurality of second lead fingers supported on a film member having a device hole for accepting a semiconductor chip, wherein the first lead fingers are bonded to corresponding one of said second lead fingers,
   a pad for mounting the semiconductor chip and for serving as a heat sink for the semiconductor chip, and
   bonding means for bonding the pad to the first lead fingers on a side of the first lead fingers opposite to that on which the second lead fingers are bonded, and for providing an electrical insulation between the pad and the first lead fingers.

2. A composite lead frame as claimed i claim 1, wherein the bonding means also bond the pad to the film member supporting the second lead fingers.

3. A composite lead frame as claimed in claim 1, wherein a heat conductivity of the pad is substantially higher than that of the lead frame.

4. A composite lead frame as claimed in claim 1, wherein the pad is substantially thicker than the lead frame.

5. A composite lead frame as claimed in claim 4, wherein the pad has a thickness sufficient that at least one surface of the pad is exposed when the semiconductor chip mounted on the pad is sealed with a sealing member.

6. A composite lead frame as claimed in claim 5, wherein the pad has a stepped cross section.

7. A composite lead frame as claimed in claim 1, wherein the second lead fingers supported on the film member having a device hole are produced by a tape automated bonding technique.

8. A semiconductor device comprising:
   a semiconductor chip,
   a lead frame having a plurality of first lead fingers,
   a plurality of second lead fingers supported on a film member having a device hole for accepting the semiconductor chip, wherein the first lead fingers are bonded to corresponding second lead fingers, and wherein the semiconductor chip is connected to the second lead fingers through bonding wires,
   a pad for mounting the semiconductor chip, and for serving as a heat sink for the semiconductor chip,
   bonding means for bonding the pad to the first lead fingers on a side of said first lead fingers opposite to that on which the second lead fingers are bonded, and for providing an, electrical insulation between the pad and the first lead fingers and
   a sealing member for sealing the semiconductor chip, the second lead fingers, bonded portions between the first lead fingers and the second lead fingers, and at least part of the pad.

9. A semiconductor device as claimed in claim 8, wherein the bonding means also bonds the pad to the film member supporting the second lead fingers.

10. A semiconductor device as claimed in claim 8, wherein a heat conductivity of the pad is substantially higher than that of the lead frame.

11. A semiconductor device as claimed in claim 8, wherein the pad is substantially thicker than the lead frame.

12. A semiconductor device as claimed in claim 11, wherein at least one surface of the pad is exposed from the sealing member.

13. A semiconductor device as claimed in claim 12, wherein the pad has a stepped cross section.

14. A semiconductor device as claimed in claim 8, wherein the second lead fingers supported on the film member having a device hole are produced by a tape automated bonding technique.

15. A composite lead frame to which a semiconductor chip is bonded, comprising:
    a pad for mounting said semiconductor chip thereto and for serving as a heat sink for said chip;
    bonding means disposed on said pad;
    a lead frame having a plurality of first leads, said first leads each having an inner end disposed on said bonding means;
    a film member disposed on said bonding means in a manner so as to be separate from the inner ends of said first leads; and
    a plurality of second leads disposed on said film member and extending to said inner ends, wherein said second leads are bonded to corresponding ones of said first leads;
    wherein said bonding means connects the pad to the first leads on a first side of said first leads opposite to a second side of said first leads to which the second leads are bonded.

* * * * *

UNITED STATES PATENT AND TRADEMARK OFFICE
CERTIFICATE OF CORRECTION

PATENT NO. : 5,227,662

DATED : July 13, 1993

INVENTOR(S) : OHNO ET AL

It is certified that error appears in the above-identified patent and that said Letters Patent is hereby corrected as shown below:

On the title page, Item

"[63] Continuation . . . Ser. No. 701,762, May 17, 1991"    to

---[63] Continuation . . . Ser. No. 701,761, May 17, 1991---.

Signed and Sealed this

Twenty-fourth Day of May, 1994

Attest:

BRUCE LEHMAN

Attesting Officer       Commissioner of Patents and Trademarks